(12) United States Patent
Yin et al.

(10) Patent No.: US 8,232,178 B2
(45) Date of Patent: Jul. 31, 2012

(54) METHOD FOR FORMING A SEMICONDUCTOR DEVICE WITH STRESSED TRENCH ISOLATION

(75) Inventors: Haizhou Yin, Poughkeepsie, NY (US); Zhijiong Luo, Poughkeepsie, NY (US); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/201,371

(22) PCT Filed: Jan. 27, 2011

(86) PCT No.: PCT/CN2011/070684
§ 371 (c)(1), (2), (4) Date: Aug. 12, 2011

(87) PCT Pub. No.: WO2012/055181
PCT Pub. Date: May 3, 2012

(65) Prior Publication Data
US 2012/0108032 A1    May 3, 2012

(30) Foreign Application Priority Data
Oct. 29, 2010    (CN) .......................... 2010 1 0527260

(51) Int. Cl.
*H01L 21/76*    (2006.01)

(52) U.S. Cl. ........ 438/424; 438/618; 438/675; 438/740; 257/E21.546; 257/E21.642

(58) Field of Classification Search .................. 438/424, 438/618, 675, 740; 257/E21.546, E21.642
See application file for complete search history.

(56) References Cited

U.S. PATENT DOCUMENTS

| | | | |
|---|---|---|---|
| 6,828,211 B2 * | 12/2004 | Chi | ............................... 438/424 |
| 7,320,926 B2 | 1/2008 | Chi | |
| 7,436,030 B2 | 10/2008 | Yang et al. | |
| 2009/0230438 A1 | 9/2009 | Luo et al. | |
| 2012/0061735 A1 * | 3/2012 | Yin et al. | ....................... 257/255 |

* cited by examiner

*Primary Examiner* — Jarrett Stark
*Assistant Examiner* — John M Parker
(74) *Attorney, Agent, or Firm* — Goodwin Procter LLP

(57) ABSTRACT

A method for forming a semiconductor device with stressed trench isolation is provided, comprising: providing a silicon substrate (S11); forming at least two first trenches in parallel on the silicon substrate and forming a first dielectric layer which is under tensile stress in the first trenches (S12); forming at least two second trenches, which have an extension direction perpendicular to that of the first trenches, in parallel on the silicon substrate, and forming a second dielectric layer in the second trenches (S13); and after forming the first trenches, forming a gate stack on a part of the silicon substrate between two adjacent first trenches, wherein the channel length direction under the gate stack is parallel to the extension direction of the first trenches (S14). The present invention supply tensile stress in the channel width direction of a MOS transistor, so as to improve performance of PMOS and/or NMOS transistors.

9 Claims, 10 Drawing Sheets

METHOD FOR FORMING A SEMICONDUCTOR DEVICE WITH STRESSED TRENCH ISOLATION

CROSS REFERENCE TO RELATED APPLICATIONS

The present application is a National Phase application of, and claims priority to, PCT Application No. PCT/CN2011/070684, filed on Jan. 27, 2011, entitled "Method for Forming a Semiconductor Device with Stressed Trench Isolation," which claimed the priority of Chinese Patent Application No. 201010527260.6, filed on Oct. 29, 2010. Both the PCT Application and Chinese Application are incorporated herein by reference in their entireties.

FIELD OF THE INVENTION

This invention relates to the field of semiconductor manufacture, and particularly to a method for forming a semiconductor device with stressed trench isolation.

BACKGROUND OF THE INVENTION

Shallow trench isolation (STI) technology is generally used to insulate adjacent NMOS and PMOS transistors in manufacturing of Complementary Metal-Oxide Semiconductor (CMOS) devices.

As described in U.S. Pat. No. 7,436,030, with the continuous scaling of the dimension of semiconductor devices, STI technology has become the preferable method for electrical isolation of CMOS devices. This is because STI stress may induce strain of the channel, which may enhance the whole performance of the semiconductor device. However, it is known for those skilled in the art that, for a CMOS device, while STI stress may enhance performance of one type of MOS transistor, e.g. NMOS transistor, it may degrade performance of another type of MOS transistor, e.g. PMOS transistor. For instance, STI tensile stress may improve the driving current of an NMOS transistor by increasing electrons mobility, while decreasing mobility of holes so that the driving current of the neighboring PMOS transistor may be decreased. Therefore, a new STI process is needed to solve the problems caused by the conventional STI process, so as to sufficiently employ the stress provided by the STI in MOS transistors.

SUMMARY OF THE INVENTION

An object of the present invention is to solve the problem that conventional STI stress may only supply driving current for a single type of MOS transistors and to make full use of the stress for MOS transistors supplied by STI.

To achieve the object, a method for forming a semiconductor device with stressed trench isolation is provided, comprising:

providing a silicon substrate;

forming at least two first trenches in parallel on the silicon substrate, and forming a first dielectric layer, which is a tensile-stressed dielectric layer, in the first trenches;

forming at least two second trenches in parallel on the silicon substrate, and forming a second dielectric layer in the second trenches, wherein the second trenches have an extension direction perpendicular to that of the first trenches; and after forming the first trenches, forming a gate stack on a part of the silicon substrate between two adjacent first trenches, wherein the length direction of the channel under the gate stack is parallel to the extension direction of the first trenches, the silicon substrate has {100} crystal indices, and the first trenches have an extension direction along <110> crystal orientation.

Optionally, the second dielectric layer is a low-stressed dielectric layer.

Optionally, the tensile-stressed dielectric layer has a tensile stress of at least 1 GPa.

Optionally, the low-stressed dielectric layer has a stress of no more than 180 MPa.

Optionally, the tensile-stressed dielectric layer is a tensile-stressed silicon nitride or a tensile-stressed silicon oxide or a tensile-stressed stack of both.

Optionally, the low-stressed dielectric layer is a low-stressed silicon nitride or a low-stressed silicon oxide or a low-stressed stack of both.

Optionally, the gate stack is formed after the first trenches and the second trenches are formed.

Optionally, the gate stack is formed after the first trenches are formed and before the second trenches are formed.

Optionally, the semiconductor device is an NMOS transistor and/or a PMOS transistor.

When the channel direction of a MOS transistor on a {100} wafer is <110>, in the channel width direction of the MOS transistor, tensile stress improves the performance of NMOS transistors as well as that of PMOS transistors. In contrast, in the channel length direction of the MOS transistors, the preferable stress type of the PMOS transistors and NMOS transistors is different. In other words, in the channel length direction, the preferable stress type of the PMOS transistor is compressed stress and the preferable stress type of the NMOS transistor is tensile stress.

Compared with the prior art, the present invention has the following advantages.

The embodiments of the present invention fills tensile-stressed dielectric layers in the first trenches with the direction parallel to the MOS transistor channel length direction, namely in the channel width direction, the tensile-stressed dielectric layers are on both sides of the MOS transistor, so as to supply a tensile stress to the MOS transistor channel width direction through a trench isolation structure, thereby increasing the response speed of the MOS transistor and improving the device performance. Furthermore, the embodiments of the present invention, which is applicable not only in PMOSFET, but also in NMOSFET, may improve the performance of the whole CMOS circuit.

Moreover, in the semiconductor manufacture process of 45 nm and even lower technical node, the extension directions of all gates are the same to simplify the gate lithography, namely the channel length direction and the channel width direction of all MOS transistors are consistent. Thus the embodiments of the present invention may be widely applied in the semiconductor manufacture process of 45 nm and even lower technical node, which offer tensile, stress in the channel width direction of all the MOS transistors and improve the performance of the device. Therefore, the embodiments of the present invention may not only fully use the STI stress, but also may improve the performance of PMOS and NMOS transistors simultaneously. Meanwhile, the embodiments are easy to perform and very practical in industry. Particularly, according to the method for forming a semiconductor device with stressed trench isolation, trenches in the channel width direction and in the channel length direction may be separately formed, which benefits for filling the trenches in the two directions separately using different materials and is easy to operate.

DETAILED DESCRIPTION OF EMBODIMENTS

The stressed STI process in prior art may only improve the performance of a single type of transistor rather than the performance of both transistors (namely, PMOS and NMOS transistors) in CMOS transistors simultaneously, which limits the application of the conventional stressed STI process.

In the embodiments of the present invention, tensile-stressed dielectric layers are filled into the first trenches which are arranged in parallel to the channel length direction of a MOS transistor. Namely, in the channel width direction, the tensile-stressed dielectric layers are located on both opposite sides of the MOS transistor, so that the tensile stress is supplied by the trench isolation structure in the channel width direction of the MOS transistor, which increases the response speed of the MOS transistor and improves the performance of the device. Furthermore, the present invention is applicable to both PMOS and NMOS transistors, so that the performance of the whole CMOS circuits may be improved.

Specifically, according to the method for forming a semiconductor device with stressed trench isolation, trenches in the channel width direction and in the channel length direction may be separately formed, which is advantageous for filling the trenches in the two directions with different materials, respectively.

Hereafter, the present invention will be described in detail with reference to embodiments in conjunction with the accompanying drawings.

Although the present invention has been disclosed hereinafter as above with reference to preferred embodiments in detail, it may be implemented in other different embodiments. Therefore, the present invention should not be limited to the embodiments disclosed herein.

Figure 1:
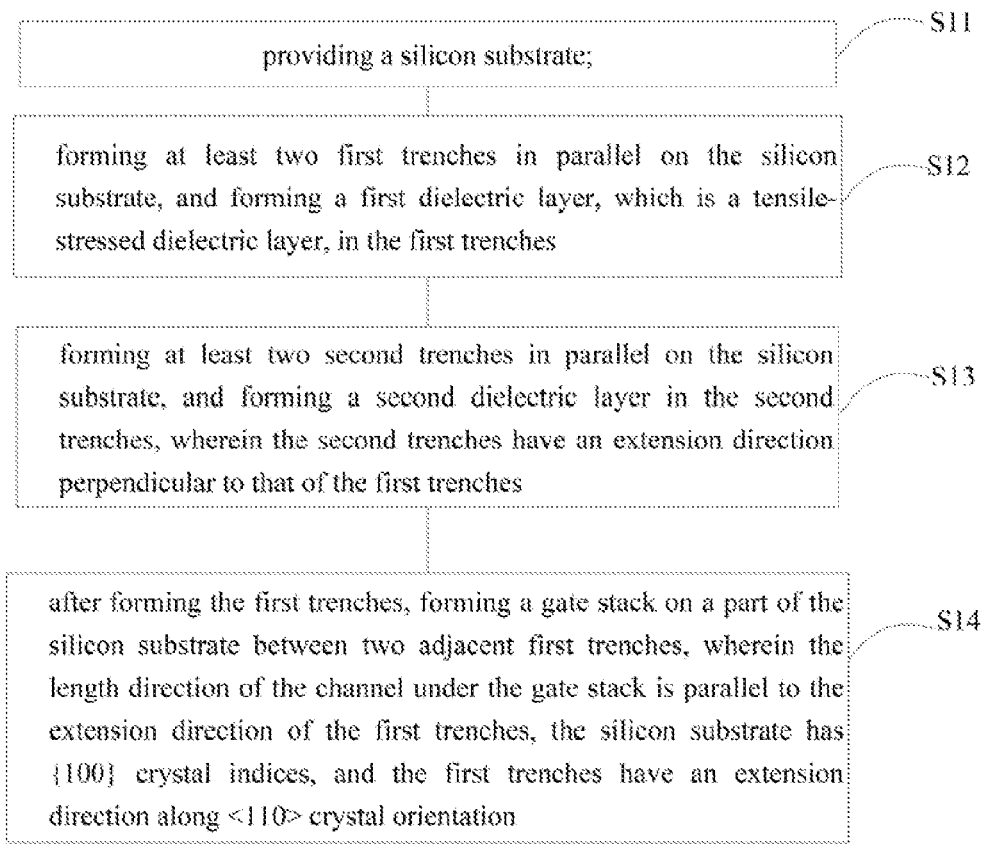
FIG. 1 is a flow chart of a method for forming a semiconductor device with stressed trench isolation according to one embodiment of the present invention.

FIG. 1 is a flow chart of a method for forming a semiconductor device with stressed trench isolation according to one embodiment of the present invention. As shown in FIG. 1, the method comprises the following steps:

Step S11, providing a silicon substrate;

Step S12, forming at least two first trenches in parallel on the silicon substrate and forming a tensile-stressed first dielectric layer in the first trenches;

Step S13, forming at least two second trenches in parallel on the silicon substrate, and forming a second dielectric layer in the second trenches, wherein the second trenches has an extension direction perpendicular to that of the first trenches; and Step S14, after forming the first trenches, forming a gate stack on a part of the silicon substrate between adjacent first trenches, wherein the direction of the channel length under the gate stack is parallel to the extension direction of the first trenches, the crystal indices of the silicon substrate are {100}, and the extension direction of the first trenches is along the crystal orientation <110>.

Referring to FIG. 1, and FIG. 2-8c, detailed description of the first embodiment of the method for forming a semiconductor device with stressed trench isolation is given below.

Figure 2:
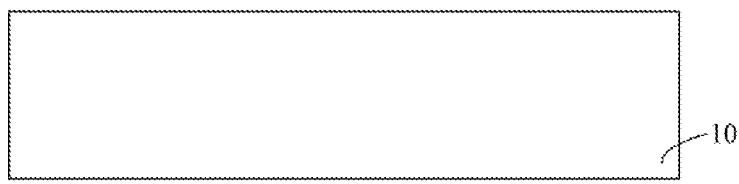
FIG. 2 and FIG. 3 are cross-sectional views of intermediate structures in a method for forming a semiconductor device with stressed trench isolation according to a first embodiment of the present invention.

Referring to FIG. 1 and FIG. 2, Step S11 is performed to provide the silicon substrate. Specifically, as shown in FIG. 2, the silicon substrate 10 preferably having {100} crystal indices (namely, the crystal indices of the silicon substrate 10 belong to the {100} family) is provided. As an unlimited example, the silicon substrate 10 has (100) crystal indices in the embodiment.

Referring to FIG. 1, FIG. 3, and FIG. 4a to FIG. 5c, Step S12 is performed to form at least two first trenches in parallel on the silicon substrate and form a tensile-stressed first dielectric layer in the first trenches.

Figure 3:
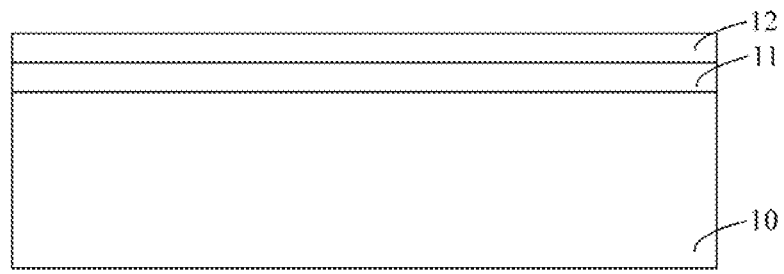

Firstly, as shown in FIG. 3, a liner layer 11 and a hard mask layer 12 are formed on the silicon substrate 10. FIG. 3 is a cross-sectional view corresponding to this step. The liner layer 11 may be made of silicon oxide, and the hard mask layer 12 may be made of silicon nitride. The hard mask layer 12 may be used as a hard mask in the following etching process.

Figure 4A:
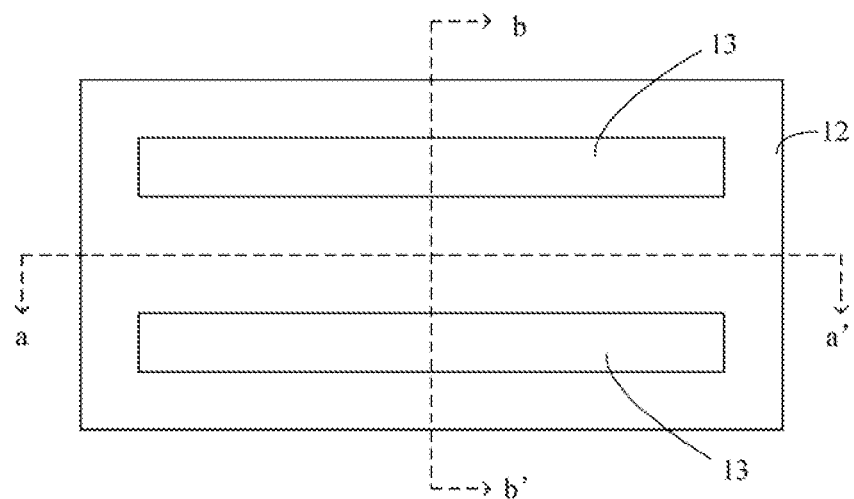
FIG. 4a to FIG. 8c are top views and corresponding cross-sectional views of intermediate structures in a method for forming a semiconductor device with stressed trench isolation according to the first embodiment of the present invention.
Figure 4B:
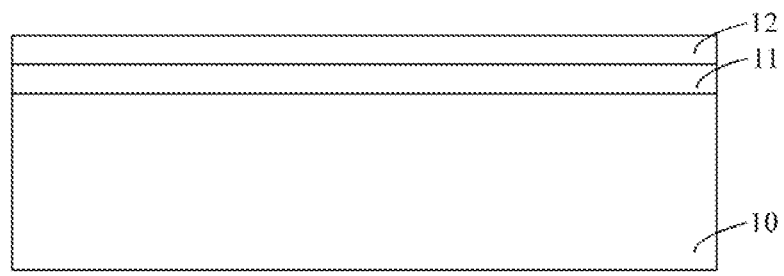
Figure 4C:
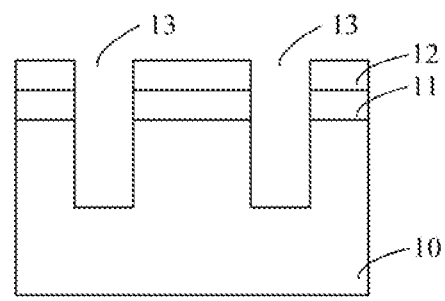

Referring to FIG. 4a to FIG. 4c, FIG. 4a is a top view of an intermediate structure according to the embodiment, FIG. 4b is a cross-sectional view along a-a' direction of FIG. 4a, and FIG. 4c is a cross-sectional view along b-b' direction of FIG. 4a. The first trenches 13 are formed in parallel on the silicon substrate 10, the method for forming the first trenches 13 comprises: forming a photoresist layer (not shown in the figures) on the hard mask layer 12 and patterning the photoresist layer to define the pattern of the first trenches 13; etching the liner layer 11 and the hard mask layer 12 with the patterned photoresist layer as a mask, and then removing the photoresist layer, for example, by using an ashing process and the like; and etching the silicon substrate 10 with the etched hard mask layer 12 as a mask to form the first trenches 13. In other embodiments, the first trenches 13 may be formed by performing a photolithography process and etching to the silicon substrate 10 without forming the liner layer 11 and the hard mask layer 12.

The first trenches 13 have an extension direction along the crystal orientation <110>, namely along the direction of crystal orientation family <110>. As an unlimited embodiment of the invention, it extends along the crystal orientation [110] herein.

Figure 5A:
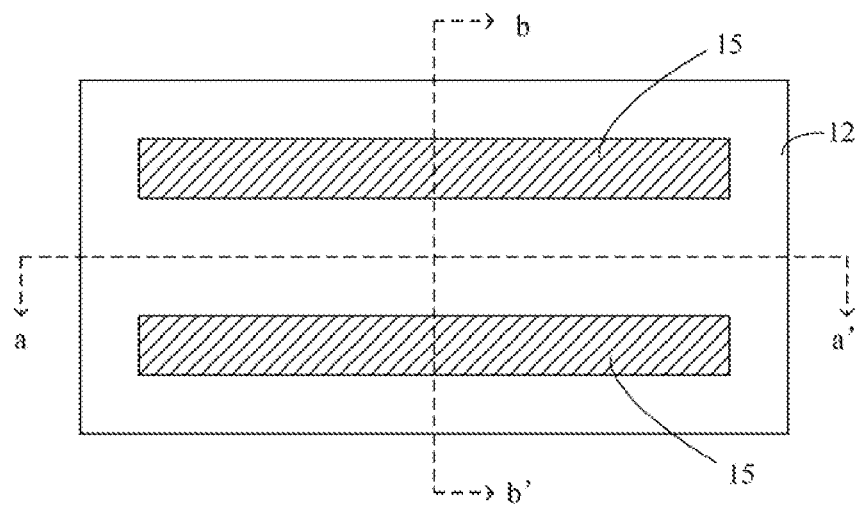
Figure 5B:
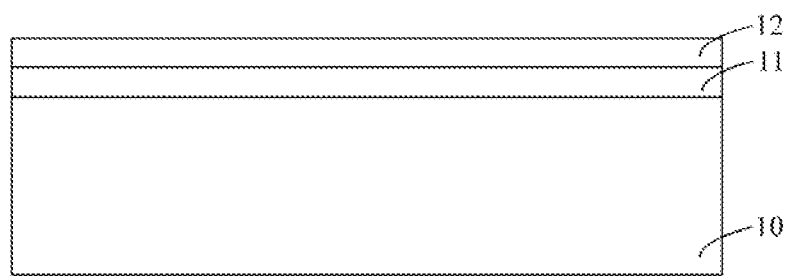
Figure 5C:
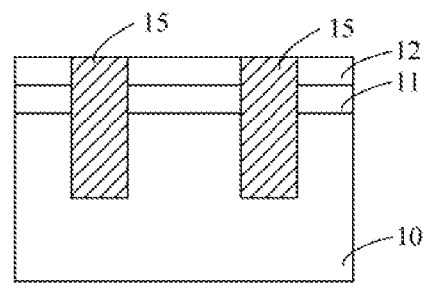

Specifically, Referring to FIG. 5a to FIG. 5c, wherein FIG. 5a is a top view of an intermediate structure according to the embodiment, FIG. 5b is a cross-sectional view along a-a' direction of FIG. 5a, and FIG. 5c is a cross-sectional view along b-b' direction of FIG. 5a. A tensile-stressed dielectric layer 15 is formed (for example, by deposition) and planarized so that the top surface of the hard mask layer 12 is flushed with the tensile-stressed dielectric layer 15, so as to fill up the first trenches with the tensile-stressed dielectric layer 15. The tensile-stressed dielectric layer 15 may be planarized by a CMP method. In other embodiments, if the liner layer 11 and the hard mask layer 12 are not formed in the former steps, the tensile-stressed dielectric layer 15 is planarized to be flushed with the top surface of the silicon substrate 10.

The tensile-stressed dielectric layer 15 may be a tensile-stressed silicon nitride or a tensile-stressed silicon oxide or a tensile-stressed stack of both, and may be formed by a method of PECVD, etc. Process parameters such as the type and magnitude of the stress of the tensile-stressed dielectric layer 15 may be adjusted by conventional methods in prior art. Preferably, the tensile-stressed dielectric layer 15 may have a tensile stress of at least 1 GPa.

Referring to FIG. 1 and FIG. 6a to FIG. 7c, Step S13 is performed to form at least two second trenches in parallel on the silicon substrate. The second trenches have an extension direction perpendicular to the extension direction of the first trenches. And then a second dielectric layer is formed in the second trenches.

Figure 6A:
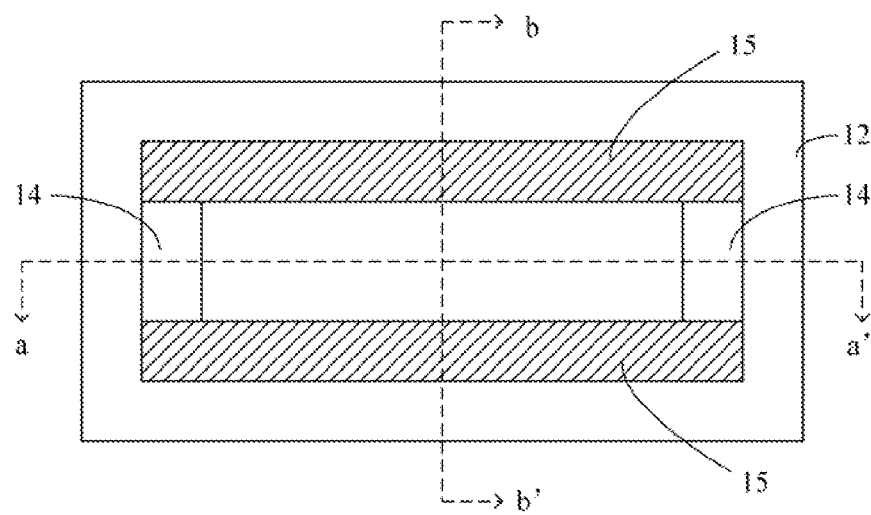
Figure 6B:
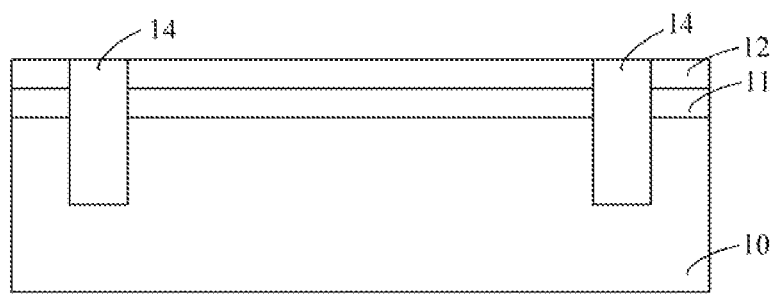
Figure 6C:
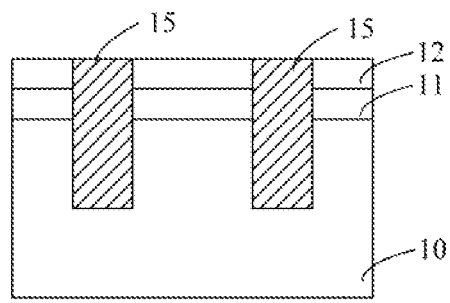

Referring to FIG. 6a to FIG. 6c, FIG. 6a is a top view of an intermediate structure according to the embodiment, FIG. 6b is a cross-sectional view along a-a' direction of FIG. 6a, and FIG. 6c is a cross-sectional view along b-b' direction of FIG. 6a. The patterns of the second trenches 14 are formed in parallel on the silicon substrate 10. Specifically, the forming method comprises: forming a photoresist layer (not shown in the drawings) on the hard mask layer 12 and patterning the photoresist layer to define the second trenches 14; etching the liner layer 11 and the hard mask layer 12 with the patterned photoresist layer as a mask and then removing the photoresist layer, for example, by an ashing process and the like; and etching the silicon substrate 10 with the etched hard mask layer 12 as a mask to form the second trenches 14. In other embodiments, the second trenches 14 may be formed by performing a photolithography process and etching to the silicon substrate 10 without forming the liner layer 11 and the hard mask layer 12. The extension direction of the second trenches 14 is perpendicular to that of the first trenches.

Figure 7A:
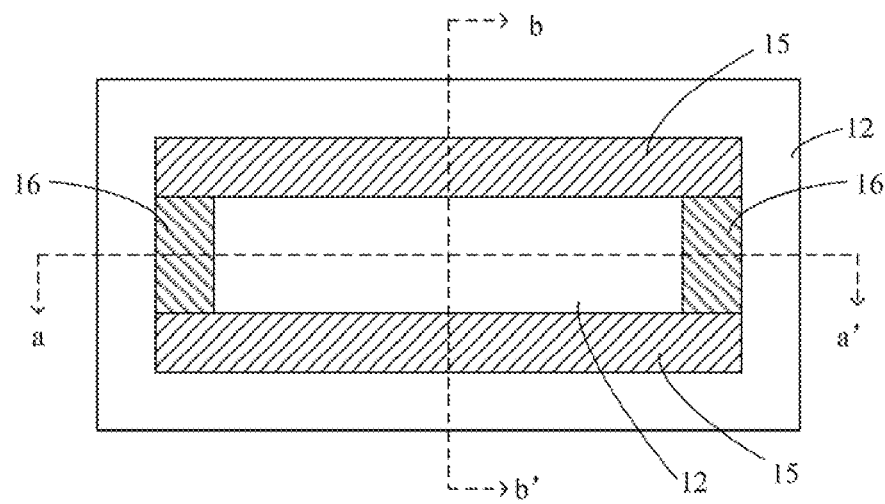
Figure 7B:
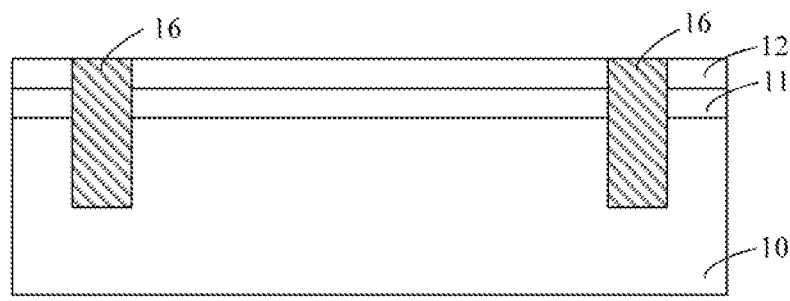
Figure 7C:
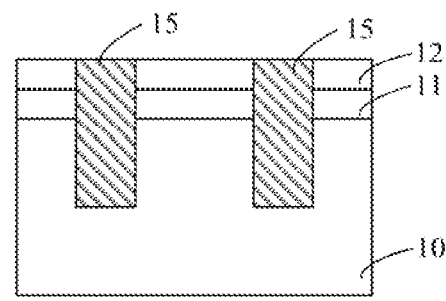

Referring to FIG. 7a to FIG. 7c, FIG. 7a is a top view of an intermediate structure according to the embodiment, FIG. 7b is a cross-sectional view along a-a' direction of FIG. 7a, and FIG. 7c is a cross-sectional view along b-b' direction of FIG. 7a. A second dielectric layer 16, specifically a low-stressed dielectric layer 16 in the embodiment, is formed by deposition, for example. Then the second dielectric layer 16 is planarized to be flushed with the top surface of the hard mask layer 12 so that the low-stressed dielectric layer 16 fills up the second trenches. The low-stressed dielectric layer 16 may be planarized by a CMP method. In other embodiments, if the liner layer 11 and the hard mask layer 12 are not formed in the former steps, the low-stressed dielectric layer 16 is planarized to form a plane with the surface of the silicon substrate 10.

The low-stressed dielectric layer 16 may be a stressed silicon nitride or a stressed silicon oxide or a stressed stack of both, and may be formed by a method of PECVD, etc. Those skilled in the prior art should understand that "low-stressed" means the stress of the low-stressed dielectric layer 16 is lower than a certain threshold. Process parameters such as the type and magnitude of the stress of the low-stressed dielectric layer 16 may be adjusted by conventional methods in prior art. Preferably, the low-stressed dielectric layer 16 may have a stress no more than 180 MPa.

Referring to FIG. 1, and FIG. 8a to FIG. 8c, Step S14 is performed to form a gate stack in a part of the silicon substrate between adjacent first trenches after the first trenches are formed. The length direction of the channel under the gate stack is parallel to the extension direction of the first trenches. The gate stack is a gate stack of the MOS transistor, and the channel length is the length of the channel of the MOS transistor corresponding to the gate stack. Detailed descriptions will be given below.

Figure 8A:
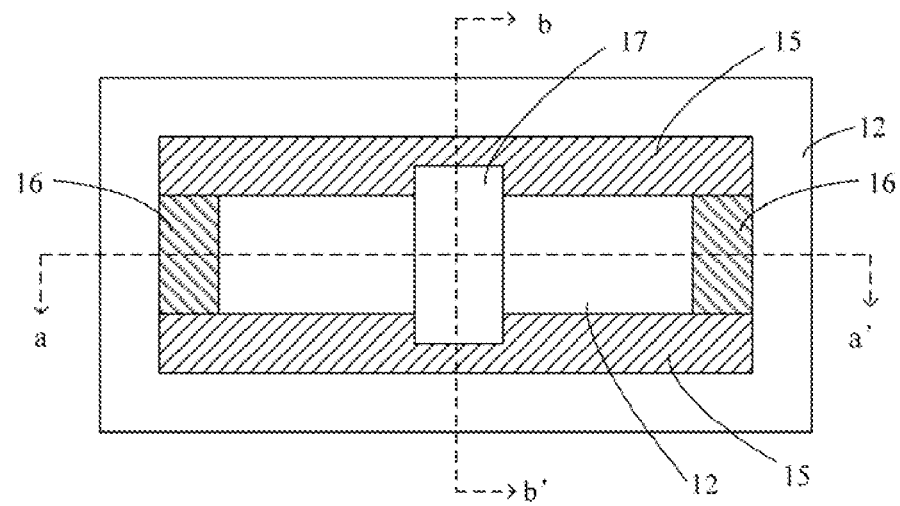
Figure 8B:
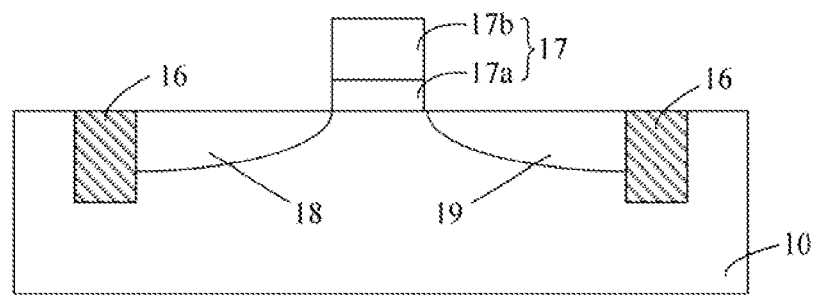
Figure 8C:
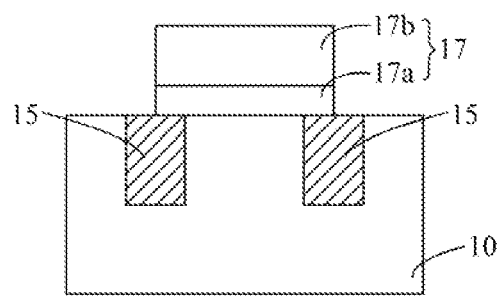

Referring to FIG. 8a to FIG. 8c, FIG. 8a is a top view of an intermediate structure according to the embodiment, FIG. 8b is a cross-sectional view along a-a' direction of FIG. 8a, and FIG. 5c is a cross-sectional view along b-b' direction of FIG. 8a. A MOS transistor is formed in a part of the silicon substrate 10 surrounded by the first trenches and the second trenches. For instance, the formation process comprises: removing the liner layer and the hard mask layer on the surface of the silicon substrate 10; forming a gate stack 17 on the silicon substrate 10 surrounded by the first trenches and the second trenches, wherein the gate stack 17 comprises a gate dielectric layer 17a and a gate electrode 17b, and in one embodiment, the gate stack 17 also comprises spacers (not shown in the drawings) on sidewalls of the gate dielectric layer 17a and of the gate electrode 17b, and the extension direction of the gate stack 17 is parallel to the that of the second trenches; and implanting ions into the part of the silicon substrate 10 surrounded by the first trenches and the second trenches with the gate stack 17 as a mask, so as to separately form a source region 18 and a drain region 19 in the silicon substrate 10 on both sides of the gate stack 17. The type of the implanted ions is determined by the MOS transistor type. For instance, the ions may be p-type for a PMOS transistor, such as boron ions, and the ions may be n-type for an NMOS transistor, such as phosphorus ions. The direction from the source 18 to the drain 19 is along the direction of the channel length, which is parallel to the extension direction of the first trenches. The extension direction of the gate stack 17 is along the width direction the channel, which is parallel to the extension direction of the second trenches.

In the semiconductor device formed in the above embodiments, the first trenches are filled up with the tensile-stressed dielectric layer 15, and the second trenches are filled up with the low-stressed dielectric layer 16, so that the tensile stress is selectively obtained in the channel width direction of the MOS transistor by the trench isolation, which consequently increases responding speed of the device and improves device performance. This solution may be applied both in PMOS and NMOS transistors.

Those skilled in the art may understand that the process of forming the second trenches may be performed at any time as appropriate after the first trenches have been formed. For instance, the process may be performed after forming the gate, or after the ion implantation, or after any other conventional processes, or after forming the MOS transistor.

FIG. 9a to FIG. 11c are top views and corresponding cross-sectional views of intermediate structures in a method for forming a semiconductor device with stressed trench isolation according to a second embodiment of the present invention. Compared with the first embodiment, Step S13 and Step S14 are interchanged in this embodiment, namely, the MOS transistor is formed after forming the first trenches, and then the second trenches are formed after the MOS transistor has been formed.

Figure 9A:
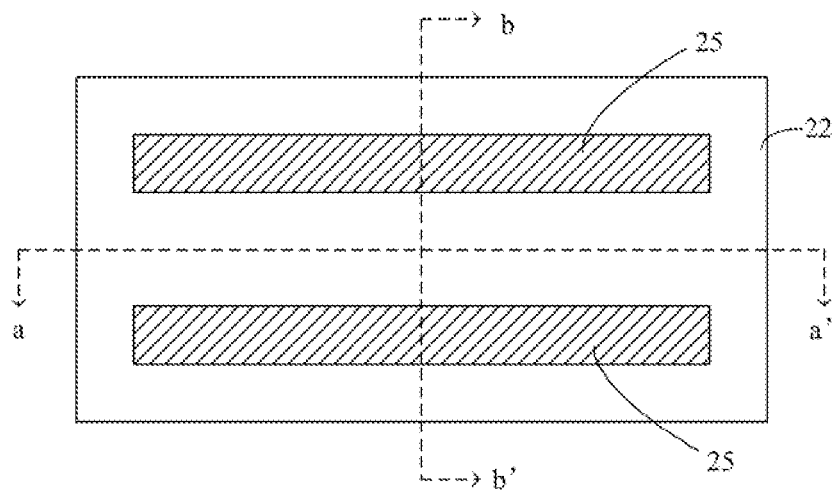
FIG. 9a to FIG. 11c are top views and corresponding cross-sectional views of intermediate structures in a method for forming a semiconductor device with stressed trench isolation according to a second embodiment of the present invention.
Figure 9B:
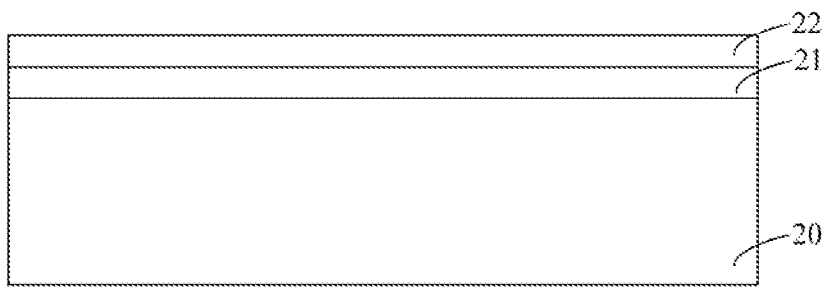
Figure 9C:
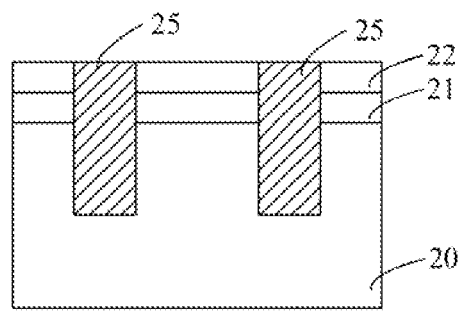

Referring to FIG. 9a to FIG. 9c, FIG. 9a is a top view of an intermediate structure according to the embodiment, FIG. 9b is a cross-sectional view along a-a' direction of FIG. 9a, and FIG. 9c is a cross-sectional view along b-b' direction of FIG. 9a. First trenches are formed in a silicon substrate 20. The extension direction of the first trenches is along the crystal orientation <110>, namely along the direction of crystal orientation family <110>. As an unlimited embodiment of the invention, the first trenches have an extension direction along the crystal orientation [110]. The first trenches are filled up with a tensile-stressed dielectric layer 25. The tensile-stressed dielectric layer 25 may be a tensile-stressed silicon nitride or a tensile-stressed silicon oxide or a tensile-stressed stack of both.

Similar to the first embodiment, before forming the first trenches, a liner layer 21 and a hard mask layer 22 may be formed sequentially on the surface of the silicon substrate 20. The liner layer 21 may be made of silicon oxide, and the hard mask layer 22 may be made of silicon nitride. The process of forming the first trenches and the tensile-stressed dielectric layer 25 may refer to the first embodiment and is omitted here.

Figure 10A:
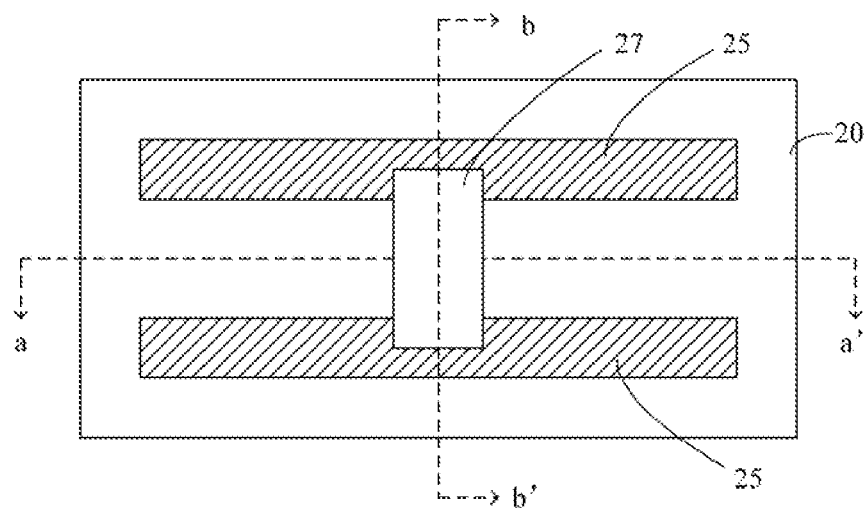
Figure 10B:
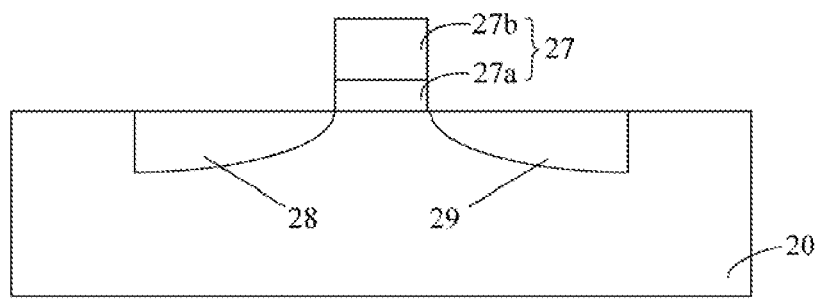
Figure 10C:
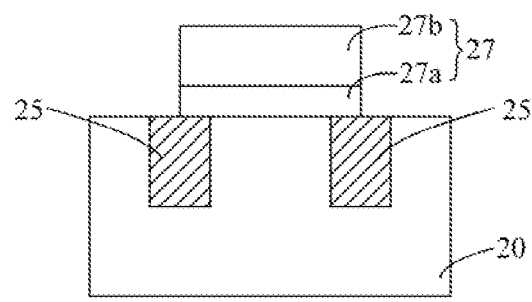

Referring to FIG. 10a to FIG. 10c, FIG. 10a is a top view of an intermediate structure according to the embodiment, FIG. 10b is a cross-sectional view along a-a' direction of FIG. 10a, and FIG. 10c is a cross-sectional view along b-b' direction of FIG. 10a. A MOS transistor is formed in the silicon substrate 10 between the first trenches. It should be noted that the liner layer 21 and the hard mask layer 22 should be removed before the MOS transistor is formed. The MOS transistor comprises a gate stack 27, and a source region 28 and a drain region 29 located in the silicon substrate 20 on both sides of the gate stack 27. The gate stack 27 comprises a gate dielectric layer 27a and a gate electrode 27b. The extension direction of the gate stack 27 is parallel to the second trenches and perpendicular to the first trenches. The MOS transistors may be PMOS transistors and/or NMOS transistors.

Figure 11A:
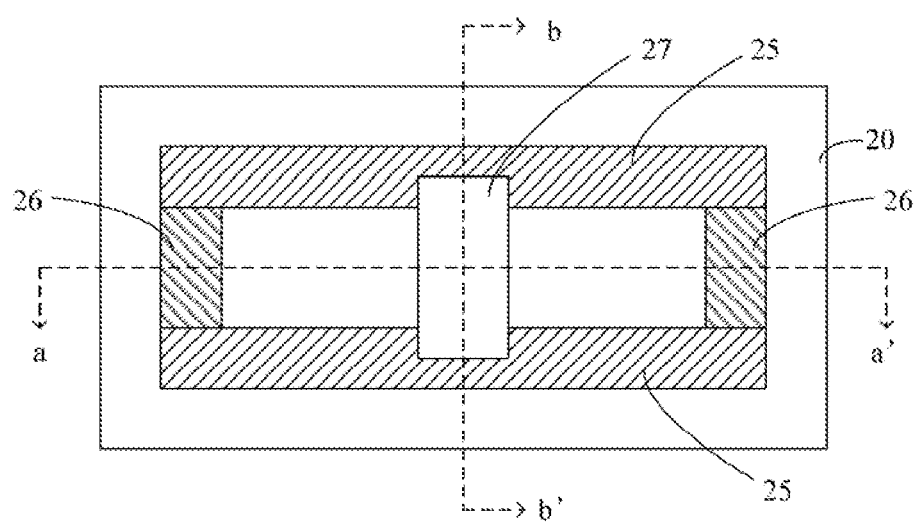
Figure 11B:
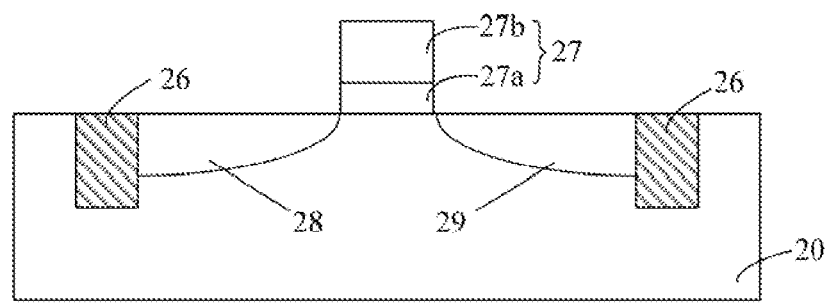
Figure 11C:
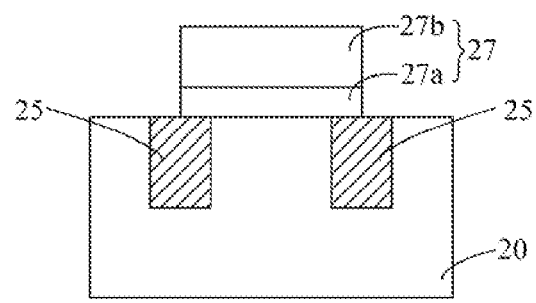

Afterwards, referring to FIG. 11a to FIG. 11c, FIG. 11a is a top view of an intermediate structure according to the embodiment, FIG. 11b is a cross-sectional view along a-a' direction of FIG. 11a, and FIG. 11c is a cross-sectional view along b-b' direction of FIG. 11a. Second trenches are formed in the silicon substrate 20, and the extension direction of the second trenches is perpendicular to the first trenches. The second trenches are filled up with a low-stressed dielectric layer 26. The second trenches and the first trenches together constitute a trench isolation structure which encompasses the MOSFET.

The low-stressed dielectric layer 26 is a low-stressed silicon nitride or a low-stressed silicon oxide or a low-stressed stack of both. The process of forming the second trenches and the low-stressed dielectric layer 26 may refer to the first embodiment, and is omitted herein.

Figure 12:
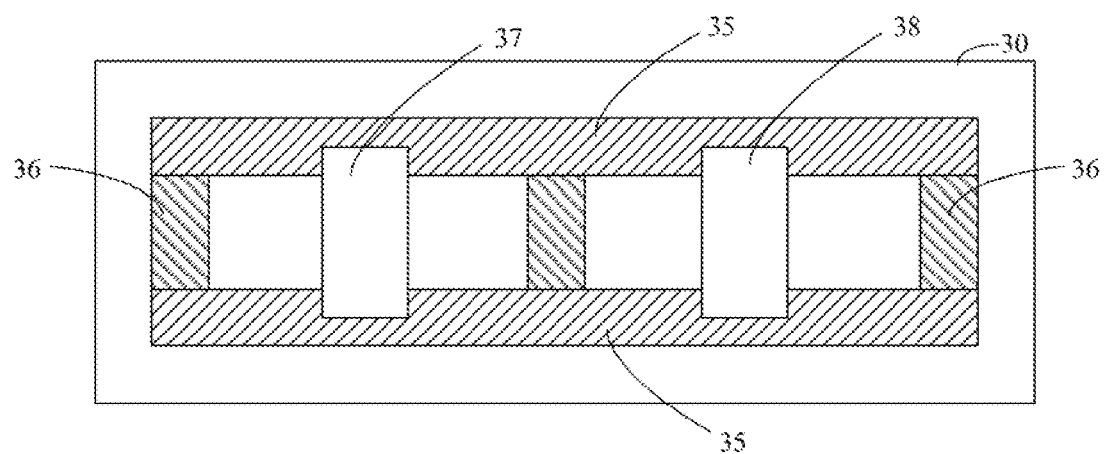
FIG. 12 is a top view of a semiconductor device formed by the method for forming a semiconductor device with stressed trench isolation according to one embodiment of the present invention.

FIG. 12 is a top view of a semiconductor device formed by the method for forming a semiconductor device with stressed trench isolation according to one embodiment of the present invention. The first trenches and the second trenches, which are perpendicular to each other, are formed separately in a silicon substrate 30. The first trenches are filled up with a tensile-stressed dielectric layer 35, and the second trenches are filled up with a low-stressed dielectric layer 36. A gate stack 37 and a gate stack 38, the extension directions of which are perpendicular to the extension direction of the first trenches and parallel to the extension direction of the second trenches, are separately located in the silicon substrate 30 encompassed by the first trenches and the second trenches. A p-type doped source region and a p-type doped drain region (not shown in the drawings) are formed in the silicon substrate 30 on both sides of the gate stack 37. The p-type doped source region and drain region, together with the gate stack 37, constitute a PMOS transistor. An n-type doped source region and an n-type doped drain region (not shown in the drawings) are formed in the silicon substrate 30 on both sides of the gate stack 38. The n-type doped source and drain regions, together with the gate stack 38, constitute an NMOS transistor. Preferably, the crystal indices of the silicon substrate 30 are {100}, and the extension direction of the first trenches is along the crystal orientation <110>.

FIG. 12 is only illustrative, and only one PMOS transistor and one NMOS transistor are shown. In other embodiments, more than one PMOS and NMOS transistors may be separately formed in the silicon substrate 30 encompassed by the first trenches and the second trenches, and may be further connected by later-formed interconnection structures to form CMOS circuits. Since the first trenches are filled up with the tensile-stressed dielectric layer 35, it may produce a tensile stress in the channel width direction of the PMOS and NMOS transistors at the same time, so as to improve the performance of both types of MOS transistors simultaneously and further improve the performance of the whole CMOS circuits.

It should be noted that in the 45 nm technical node and beyond, in order to simplify the lithography process, during the semiconductor manufacturing process, the gate stacks of all MOS transistors have the same extension directions. According to the embodiments of the present invention, the first trenches and the second trenches are formed on the silicon substrate to cross each other, so as to form rectangular lattices. Afterwards, gate stacks having the same extension direction are separately formed in the silicon substrate in each rectangular region surrounded by the first trenches and the second trenches, thereby simplifying the process for forming the CMOS circuits. Therefore, the embodiments of the present invention may be widely used in the semiconductor manufacture technology of 45 nm technical node and beyond, and may provide a tensile stress in the channel width direction of each MOS transistor, so as to improve device performance. Therefore, the embodiments of the present invention not only may sufficiently employ stressed STIs, but also may improve the performance of both PMOS and NMOS transistors. Moreover, the embodiments of the present invention are easy to implement and have good industrial applicability.

Furthermore, after forming the MOS transistors, a dual-stress liner technology may be incorporated. Specifically, a tensile-stressed liner layer may be formed in the NMOS transistor, and a compressive-stressed liner layer may be formed in the PMOS transistor, so as to further increase response speed of the device.

Therefore, according to the embodiments of the present invention, the tensile-stressed dielectric layer fills up the first trenches along the channel length direction, and the low-stressed dielectric layer fills up the second trenches along the channel width direction, so as to selectively generate a tensile stress along the channel width direction, thereby improving the performance of MOS transistors. Meanwhile, the embodiments of the present invention may be applied in NMOS transistors and PMOS transistors simultaneously.

Particularly, according to the method for forming a semiconductor device with stressed trench isolation of the present invention, trenches along the channel width direction and along the channel length direction may be separately formed, which is advantageous for separately filling the trenches in these two directions with different materials, which is easy and convenient to implement.

Although the present invention has been disclosed as above with reference to preferred embodiments, it is not intended to limit the present invention. Those skilled in the art may modify and vary the embodiments without departing from the spirit and scope of the present invention. Accordingly, the scope of the present invention shall be defined in the appended claims.

What is claimed is:

1. A method for forming a semiconductor device with stressed trench isolation, comprising:
   providing a silicon substrate;
   forming at least two first trenches in parallel on the silicon substrate, and forming a first dielectric layer, which is a tensile-stressed dielectric layer, in the first trenches;
   forming at least two second trenches in parallel on the silicon substrate, and forming a second dielectric layer in the second trenches, wherein the second trenches have an extension direction perpendicular to that of the first trenches; and
   after forming the first trenches, forming a gate stack on a part of the silicon substrate between two adjacent first trenches, wherein the length direction of the channel under the gate stack is parallel to the extension direction of the first trenches, the silicon substrate has $\{100\}$ crystal indices, and the first trenches have an extension direction along $<110>$ crystal orientation.

2. The method according to claim 1, wherein the second dielectric layer is a low-stressed dielectric layer.

3. The method according to claim 2, wherein the low-stressed dielectric layer has a stress of no more than 180 MPa.

4. The method according to claim 2, wherein the low-stressed dielectric layer is a low-stressed silicon nitride or a low-stressed silicon oxide or a low-stressed stack of both.

5. The method according to claim 1, wherein the tensile-stressed dielectric layer has a tensile stress of at least 1 GPa.

6. The method according to claim 1, wherein the tensile-stressed dielectric layer is a tensile-stressed silicon nitride or a tensile-stressed silicon oxide or a tensile-stressed stack of both.

7. The method according to claim 1, wherein the gate stack is formed after the first trenches and the second trenches are formed.

8. The method according to claim 1, wherein the gate stack is formed after the first trenches are formed and before the second trenches are formed.

9. The method according to claim 1, wherein the semiconductor device is an NMOS transistor and/or a PMOS transistor.

* * * * *